(12) United States Patent
Boettiger et al.

(10) Patent No.: US 7,375,892 B2
(45) Date of Patent: May 20, 2008

(54) ELLIPSOIDAL GAPLESS MICROLENS ARRAY AND METHOD OF FABRICATION

(75) Inventors: Ulrich C. Boettiger, Boise, ID (US); Jin Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 65 days.

(21) Appl. No.: 11/213,816

(22) Filed: Aug. 30, 2005

(65) Prior Publication Data
US 2006/0023312 A1    Feb. 2, 2006

Related U.S. Application Data

(63) Continuation-in-part of application No. 10/681,308, filed on Oct. 9, 2003, now Pat. No. 7,227,692.

(51) Int. Cl.
*G02B 27/10* (2006.01)
(52) U.S. Cl. ...................... 359/619; 359/628
(58) Field of Classification Search ................ 359/619, 359/620, 626, 628
See application file for complete search history.

(56) References Cited

U.S. PATENT DOCUMENTS

| | | | |
|---|---|---|---|
| 5,694,246 A | 12/1997 | Aoyama et al. | |
| 5,997,756 A | 12/1999 | Okazaki et al. | |
| 6,734,031 B2 * | 5/2004 | Shizukuishi | 438/22 |
| 2002/0001133 A1 * | 1/2002 | Magee | 359/619 |
| 2003/0002160 A1 * | 1/2003 | Johnson et al. | 359/619 |
| 2003/0132367 A1 | 7/2003 | Suzuki et al. | |
| 2003/0210462 A1 * | 11/2003 | Freese et al. | 359/455 |
| 2003/0215967 A1 | 11/2003 | Shizukuishi | |
| 2005/0078377 A1 | 4/2005 | Li et al. | |

OTHER PUBLICATIONS

U.S. Appl. No. 10/638,824, filed Aug. 11, 2003, Lin et al.
U.S. Appl. No. 11/002,231, filed Dec. 3, 2004, Boettiger et al.
U.S. Appl. No. 11/209,758, filed Aug. 24, 2005, Boettiger.
U.S. Appl. No. 11/209,695, filed Aug. 24, 2005, Boettiger.
Copy of International Search Report, mail date Dec. 27, 2006.

* cited by examiner

*Primary Examiner*—Alicia M. Harrington
(74) *Attorney, Agent, or Firm*—Dickstein Shapiro LLP

(57) ABSTRACT

Ellipse-shaped microlenses focus light onto unbalanced photosensitive areas, increase area coverage for a gapless layout of microlenses, and allow pair-wise or other individual shifts of the microlenses to account for asymmetrical pixels and pixel layout architectures. The microlenses may be fabricated in sets, with one set oriented differently from another set, and may be arranged in various patterns, for example, in a checkerboard pattern or radial pattern. The microlenses of at least one set may be substantially elliptical in shape. To fabricate a first set of microlenses, a first set of microlens material is patterned onto a support, reflowed under first reflow conditions, and cured. To fabricate a second set of microlenses, a second set of microlens material is patterned onto the support, reflowed under second reflow conditions, which may be different from the first conditions, and cured.

18 Claims, 11 Drawing Sheets

ELLIPSOIDAL GAPLESS MICROLENS ARRAY AND METHOD OF FABRICATION

CROSS-REFERENCE TO RELATED APPLICATIONS

This application is a Continuation In Part (C.I.P.) of application Ser. No. 10/681,308, filed Oct. 9, 2003 now U.S. Pat. No. 7,227,692, the entire disclosure of which is incorporated herein by reference.

FIELD OF THE INVENTION

The present invention relates generally to the field of semiconductor-based imager devices using microlenses, and more particularly to the fabrication of an array of microlenses.

BACKGROUND OF THE INVENTION

The semiconductor industry currently uses different types of semiconductor-based imagers, such as charge coupled devices (CCDs), CMOS active pixel sensors (APS), photodiode arrays, charge injection devices and hybrid focal plane arrays, among others, that use an array of microlenses. Semiconductor-based displays using microlenses are also being developed.

Use of microlens significantly improves the photosensitivity of the imaging device by collecting light from a large light collecting area and focusing it onto a small photosensitive area of a photosensor. As the size of imager arrays and photosensitive regions of pixels continue to decrease, it becomes increasingly difficult to provide a microlens capable of focusing incident light rays onto the photosensitive regions of the pixel. This problem is due in part to the increased difficulty in constructing a microlens that has the optimal focal characteristics for the increasingly smaller imager device. Microlens shaping during fabrication is important for optimizing the focal point for the microlens. This in turn increases the quantum efficiency for the underlying pixel array. Utilizing a spherical microlens shape is better for focusing incoming light onto a narrow focal point, which allows for the desired decrease in photosensor size. Spherical microlenses, however, suffer from gapping problems which are undesirable (described below).

Microlenses may be formed through either a subtractive or an additive process. In the additive process, a lens material is formed on a substrate and subsequently is formed into a microlens shape.

In conventional additive microlens fabrication, an intermediate material is deposited onto a substrate and formed into a microlens array using a reflow process. Each microlens is formed with a minimum distance, typically no less than 0.3 microns, between adjacent microlenses. Any closer than 0.3 microns may cause two neighboring microlenses to bridge during reflow. In the known process, each microlens is patterned as a single square with gaps around it. During the reflowing of the patterned square microlenses, a gel drop is formed in a partially spherical shape driven by the force equilibrium of surface tension and gravity. The microlenses then harden in this shape. If the gap between two adjacent gel drops is too narrow, the drops may touch and merge, or bridge, into one large drop. The effect of bridging is that it changes the shape of the lenses, which leads to a change in focal length or, more precisely, the energy distribution in the focal range. A change in the energy distribution in the focal range leads to a loss in quantum efficiency of, and enhanced cross-talk between, pixels. The gaps, however, allow unfocused photons through the empty spaces in the microlens array, leading to lower quantum efficiency and increased cross-talk between respective photosensors of adjacent pixels.

It is desirable to form a microlens array having differently shaped microlenses. However, if the known techniques, which use a single reflow step, were used to form such microlenses, the differently shaped microlenses would have different focal characteristics, which would lead to poor focusing for certain photosensors and/or the need to modify the locations, shape, or symmetries of some photosensors.

It is desirable to enhance the amount of light received from the microlenses and focused on the photosensors of an imager. It is also desirable to form a microlens array with varied sized and shaped microlenses, each having a focal length and focal position optimized for the color or wavelength of light it is detecting. It is also desirable to form a microlens array having minimized gapping between the microlenses without causing bridging during the microlens fabrication reflow process.

BRIEF SUMMARY OF THE INVENTION

Embodiments of the present invention provide an improved microlens array and methods of forming it. Ellipse-shaped microlenses are formed to focus fight onto unbalanced photosensitive areas and increase area coverage in a gapless layout of microlenses. The ellipse-shaped microlenses allow pair-wise or other individual shifts of the microlenses to account for asymmetries of shared pixel layout architectures. The microlenses may be fabricated in sets, with one set oriented differently from another set, and may be arranged in various patterns, for example, in a checkerboard or radial pattern. The microlenses of at least one set may be substantially elliptical in shape.

To fabricate a first set of microlenses, a first set of microlens material is patterned onto a support, reflowed under first reflow conditions, and cured. To fabricate a second set of microlenses, a second set of microlens material is patterned onto the support, reflowed under second reflow conditions, which may be different from the first conditions, and cured.

These and other features of the various embodiments of the invention will be more readily understood from the following detailed description of the invention which is provided in connection with the accompanying drawings.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The term "substrate," as used herein, is to be understood as including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photosensor device and associated structures for converting photons to an electrical signal. For purposes of illustration, a single representative three-color pixel and its manner of formation is illustrated in the figures and description herein; however, typically fabrication of a plurality of like pixels proceeds simultaneously. Accordingly, the following detailed description is not to be taken in a limiting sense, and the scope of the present invention is defined only by the appended claims.

Finally, while the invention is described with reference to a semiconductor-based imager, such as a CMOS imager, it should be appreciated that the invention may be applied in any micro-electronic or micro-optical device that requires high quality microlenses for optimized performance. Other exemplary micro-optical devices that can employ the invention include CCDs and display devices where pixels employ a photoemitter, as well as others.

Figure 1:
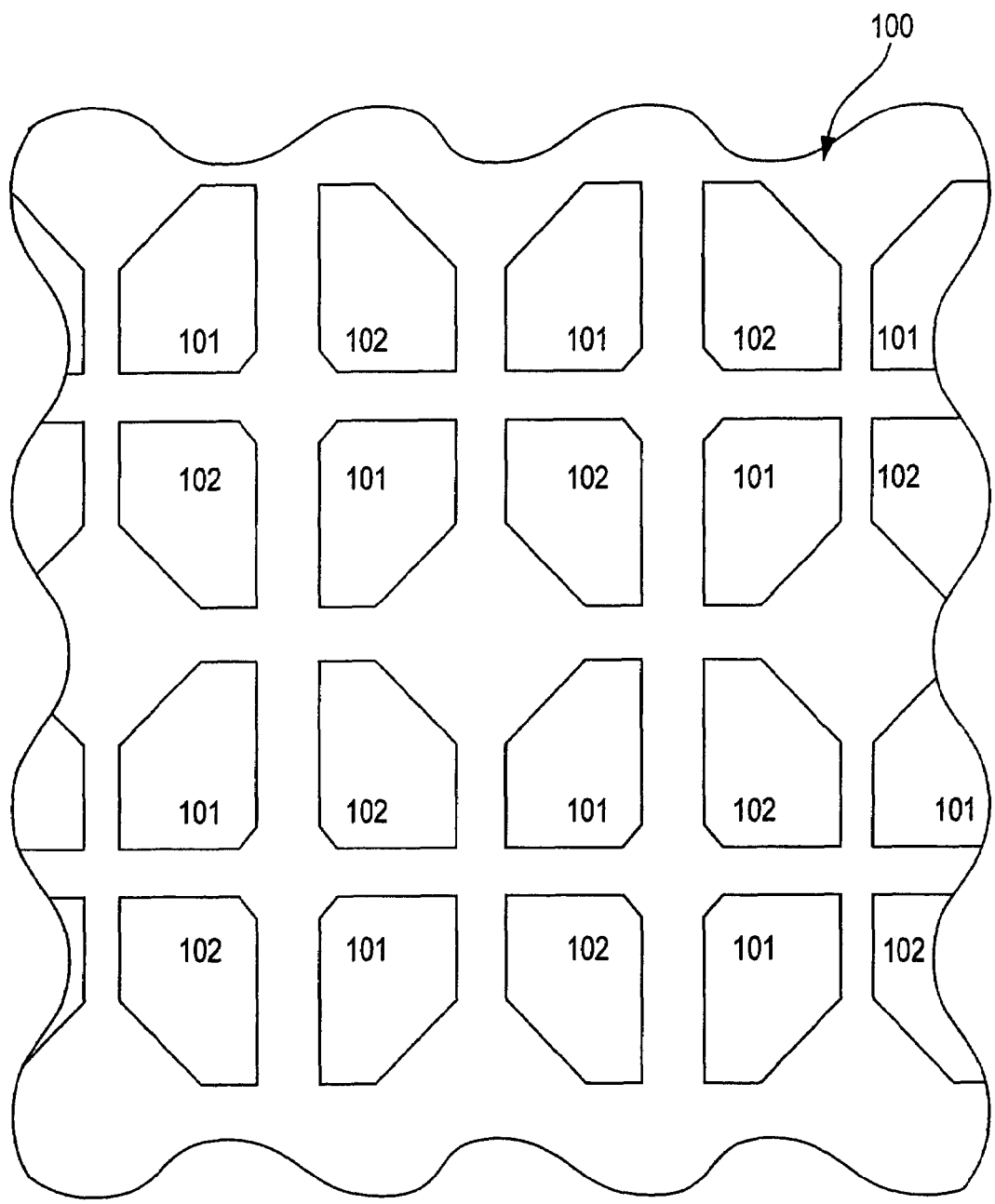
FIG. 1 is a top view of an array of pixels having non-symmetrically shaped photo-sensitive areas.

Referring now to FIG. 1, an array of imaging pixels 100 having asymmetrically shaped photosensitive areas 101, 102 is shown. In this depiction of an array of pixels 100, microlenses and metal lines for communication with row and column drivers and other circuitry of an image sensor device have not yet been formed over the pixels. Because the photosensitive areas 101, 102 are asymmetrical, spherically shaped microlenses would be unable to direct light to some regions of the areas 101, 102, while delivering most of the incident light to other regions of the photosensitive areas 101, 102. Such a distribution of photons leads to loss in quantum efficiency.

Figure 2:
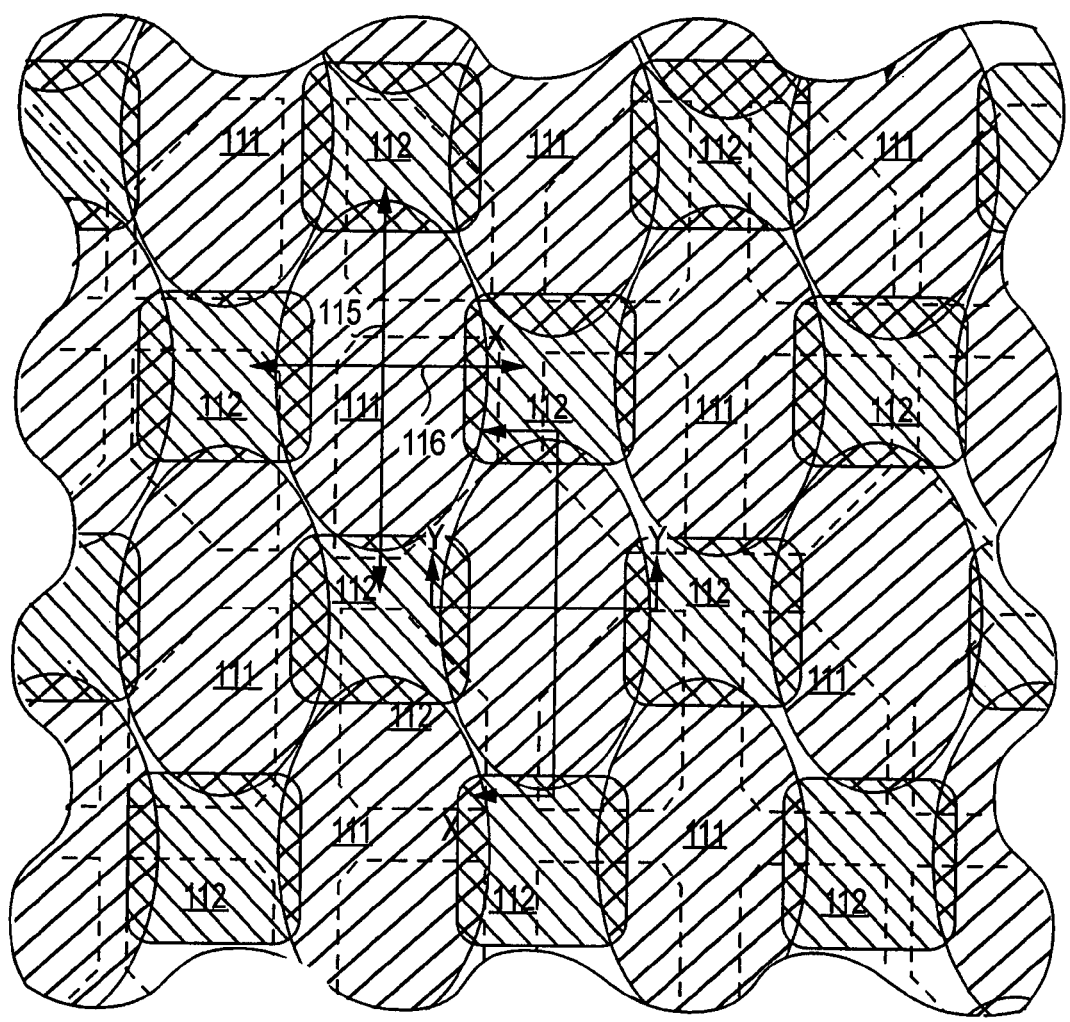
FIG. 2 is a top view of an array of microlenses constructed in accordance with an exemplary embodiment of the invention over the FIG. 1 array of pixels.

Referring now to FIG. 2, an array of microlenses 110 formed over pixel array 100 is shown. The array 110 includes a plurality of first microlenses 111 and a plurality of second microlenses 112, each being formed over the pixel array 100. The first microlenses 111 are formed for photosensitive areas 101 (FIG. 1) and the second microlenses 112 are formed for photosensitive areas 102 (FIG. 1). The first microlenses 111 are shown to have a substantially elliptical shape, while the second microlenses 112 are shown to have a substantially square shape. The edges of second microlenses 112 slightly overlap the edges of first microlenses 111.

Each of the first microlenses 111 can be formed to have a first focal length in a longitudinal axis 115 and a second focal length in a lateral axis 116, varied by adjusting the major and minor axes of the elliptical shape. Each of the second microlenses 112 can be formed to have a focal length of similar length as the first focal length of the first microlenses 111 or the second focal length of the first microlenses 111. Alternatively, the second microlenses 112 can be formed to have a third focal length. In any case, the microlenses 111, 112 can be formed to have different focal lengths to cater to the shape and dimensions of the corresponding photosensitive areas 101, 102 in the semiconductor substrate 120.

Figure 3A:
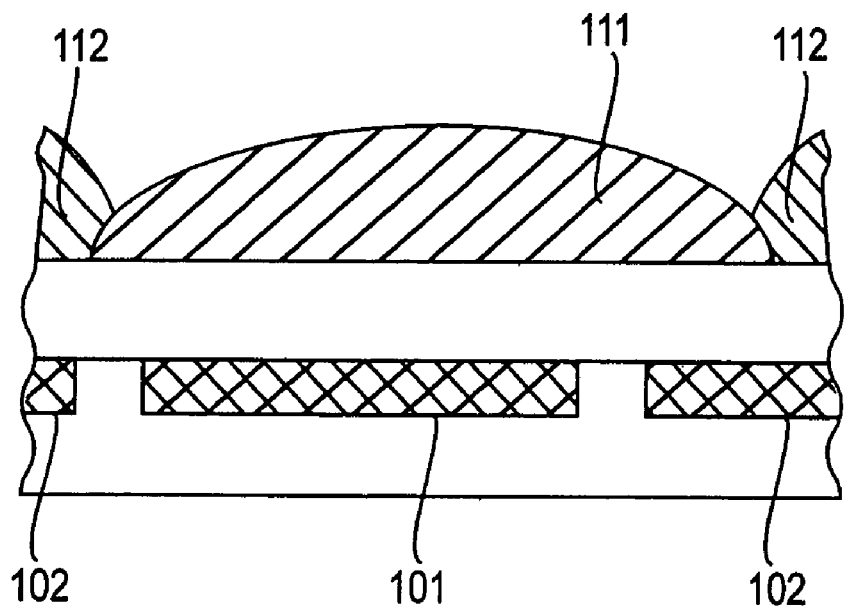
FIG. 3a is a cross-section taken along line X-X of FIG. 2.
Figure 3B:
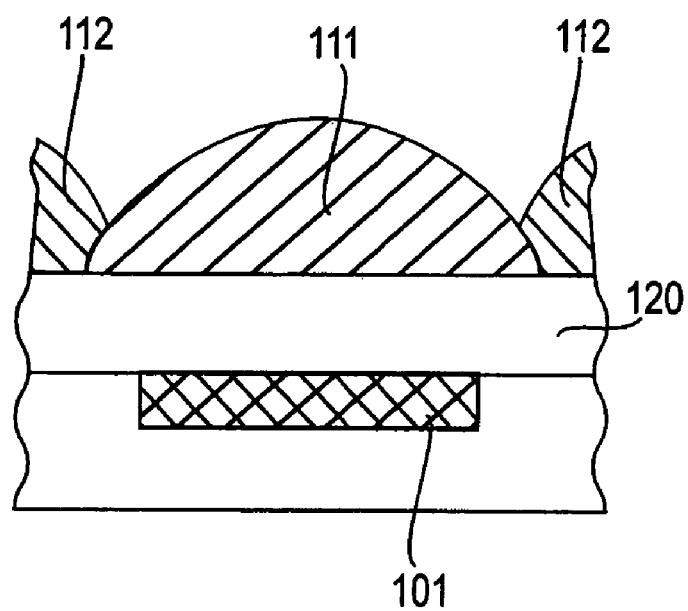
FIG. 3b is a cross-section taken along line Y-Y of FIG. 2.

FIG. 3a is a cross-section taken across line X-X of FIG. 2. Line X-X of FIG. 2 is drawn along the longitudinal axis of the first microlens 111. FIG. 3b is a cross-section taken across line Y-Y of FIG. 2. Line Y-Y of FIG. 2 is drawn along the lateral axis of the first microlens 111. It should be noted that FIGS. 3a and 3b are not actual cross-sections through an imager, but only schematical representations of the locational relationship of the microlenses to the photosensitive areas in an imager. For example, semiconductor substrate 120 represents several layers of an imager including, but not limited to, passivation layers, metallization layers, and color filter array layers.

As can be seen from FIGS. 2, 3a, and 3b, the first microlens 111 is longer in the longitudinal direction than it is in the lateral direction. Also, the first microlens 111 may be formed to focus light from an area outside of the first photosensitive region 101 to the first photosensitive region 101.

The second microlenses 112 are shaped differently than the first microlenses 111, as shown, thereby maximizing the amount of space covered by a microlens. Since light transmitted without going through a microlens is not properly focused relative to any photosensitive areas, and may increase the incidence of cross-talk between pixels, there is great benefit to maximizing the amount of space covered by a microlens.

Figure 4:
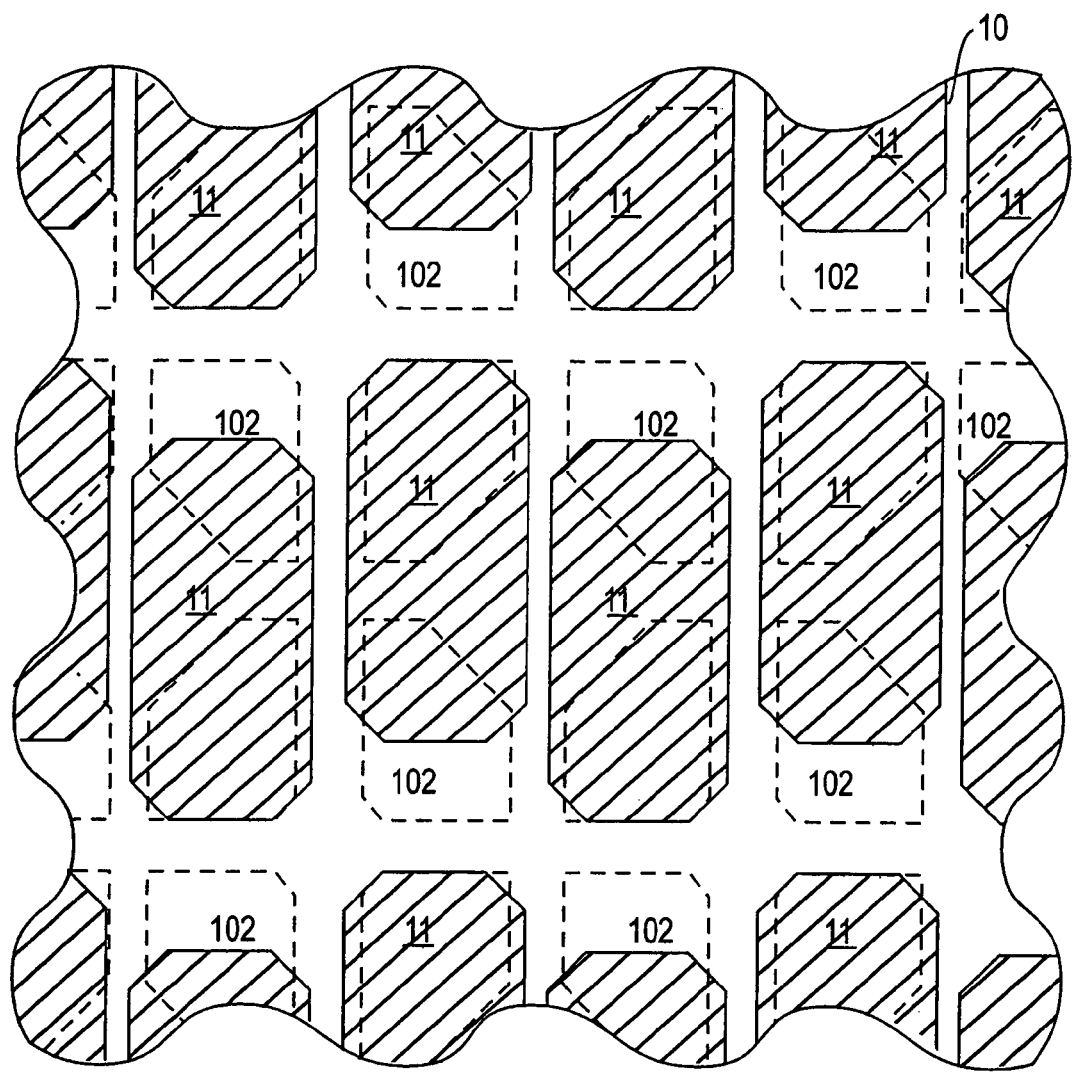
FIG. 4 is a top view of a step of fabricating the microlens array of FIG. 2.

The first microlenses 111 are formed from a first microlens material 11. The first microlens material 11 (FIG. 4) is deposited and patterned upon a support substrate 120. The substrate 120 is formed of any suitable material which is transparent to electromagnetic radiation. Each deposition of the first microlens material 11 has an elongated hexagon-shaped configuration, which is substantially equal in size with the others. The first microlens material 11 is a material which, upon reflow, forms into a solidly cross-linked polymer impervious to subsequent reflow processes. During a reflow process conducted under reflow conditions, the elongated hexagon-shaped configuration of the first microlens material 11 is transformed into the first microlens 111, which has an elliptically-shaped configuration with rounded edges and a curved top. The first microlenses 111, which are transparent to electromagnetic radiation, will retain their shape even if a subsequent reflow process is performed.

Figure 5:
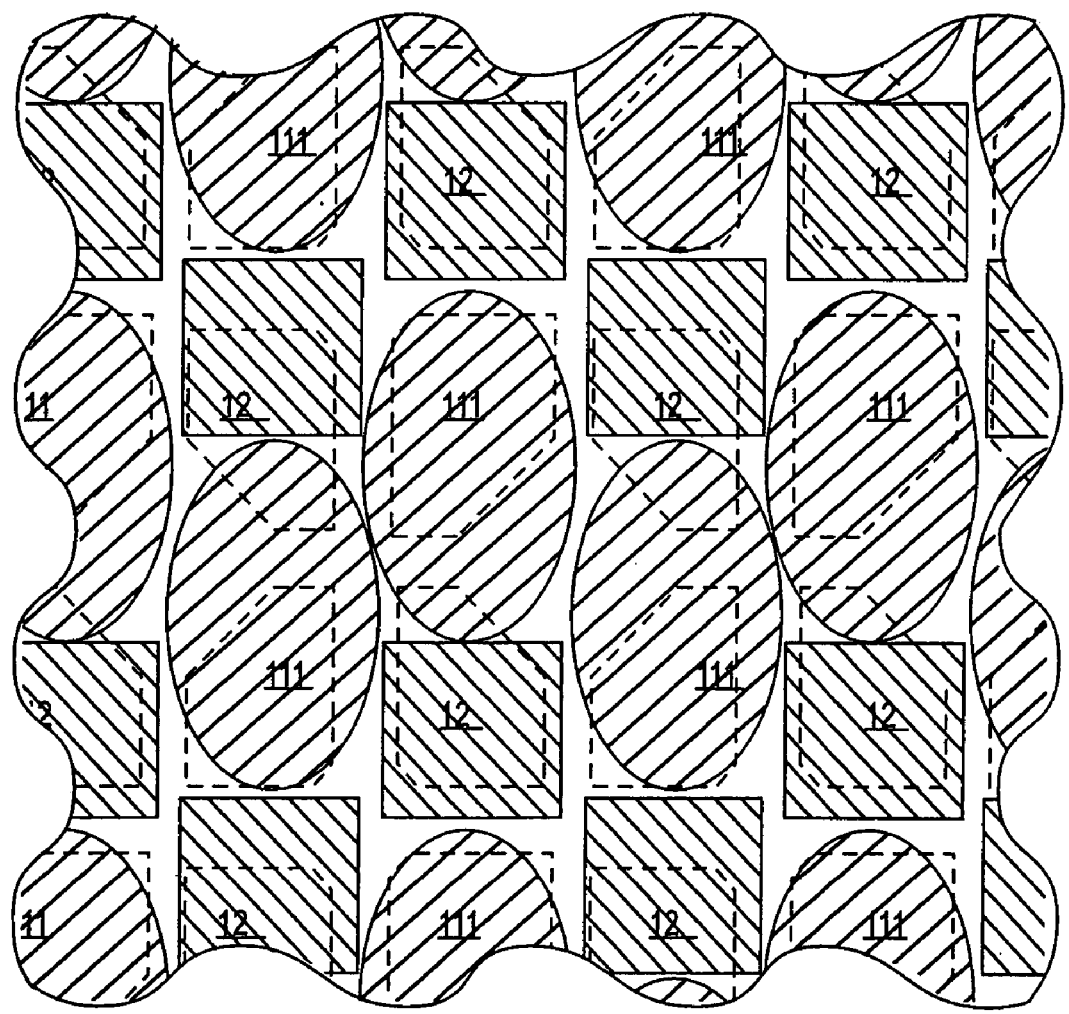
FIG. 5 is a top view of a subsequent step of fabricating the microlens array of FIG. 2.

After patterning and reflowing the first microlens material 11 to form the first solidly cross-linked polymer microlenses 111, a second microlens material 12 is patterned as shown in FIG. 5. The second microlens material 12, patterned in a substantially square-shaped configuration, is positioned in some of the spaces between the first microlenses 111. Additionally, portions of second microlens material 12 can be formed overlapping the first microlenses 111, if desired.

Reflowing and curing of the second microlens material 12 under reflow conditions, which may differ from the conditions of the reflow of the first microlens material 11, forms second microlenses 112, as shown in FIG. 2. The second microlenses 112 are impervious to subsequent reflow, just like the first microlenses 111. The second microlenses 112, which are of a different size and shape than the first microlenses 111, specifically, a smaller size, are each somewhat square-shaped in configuration with rounded corners and a curved top. More particularly, the second microlenses 112 have a similar curvature and a smaller surface area than the first microlenses 111. It should be appreciated that, in another embodiment, the second microlenses 112 may be larger than the first microlenses 111.

A microlens array 110 is thus formed, and includes any combination of two or more pluralities of microlenses 111, 112. By fabricating the microlens array 110 by forming first microlenses 111 spaced apart, e.g., in a checkerboard fashion, and filling in the spaces with second microlenses 112 formed in a separate process, bridging between adjacent first microlenses 111 and between first and second microlenses 111, 112 is diminished. This is because the first microlenses 111 have already gone through a reflow process that has rendered them impervious to any subsequent reflow process. Thus, the subsequent reflow of the second microlens material 12 into the second microlenses 112 will not cause bridging between the first and second microlenses 111, 112 or between a pair of second microlenses 112. The microlens array 110 is approximately space-less since the formed microlenses abut one another.

By forming the microlenses 111, 112 through separate reflow processes, the microlens array 110 can be formed to provide greater signal strength for pixels that would typically exhibit lower signal strength. For example, photosensitive areas 101 may tend to produce an inherently lower output signal for a given light intensity due to a blue color filter being provided over it. Thus, the microlens array 110 can be formed by creating larger microlenses, such as the first microlenses 111, which will collect more light and help balance pixel signal strength for the different colored pixels of a pixel array. A balanced signal between colors assists the dynamic range of the photosensors in pixels because it avoids systematically sending pixels of one color into saturation while other pixels are only partially saturated.

It should be appreciated that other shaped microlenses may be formed in any spaces on a substrate after the second plurality of microlenses. For example, after the second microlenses are formed, a third microlens material may be patterned in substantially square-, elliptical-, or other shapes in spaces between the first microlenses, the first and second microlenses, and/or the second microlenses, as necessary. Reflowing and curing of the third microlens material are performed under reflow conditions different from the first and second microlens material.

It should also be appreciated that a third plurality of microlenses may be formed with the second plurality microlenses in a single reflow process. When the third microlenses and the second microlenses are spatially separated from one another, for example, with the first microlenses between them, bridging is not likely.

Exemplary materials that may be used as microlens materials include, but are not limited to MFR-401 from JSR.

Figure 6:
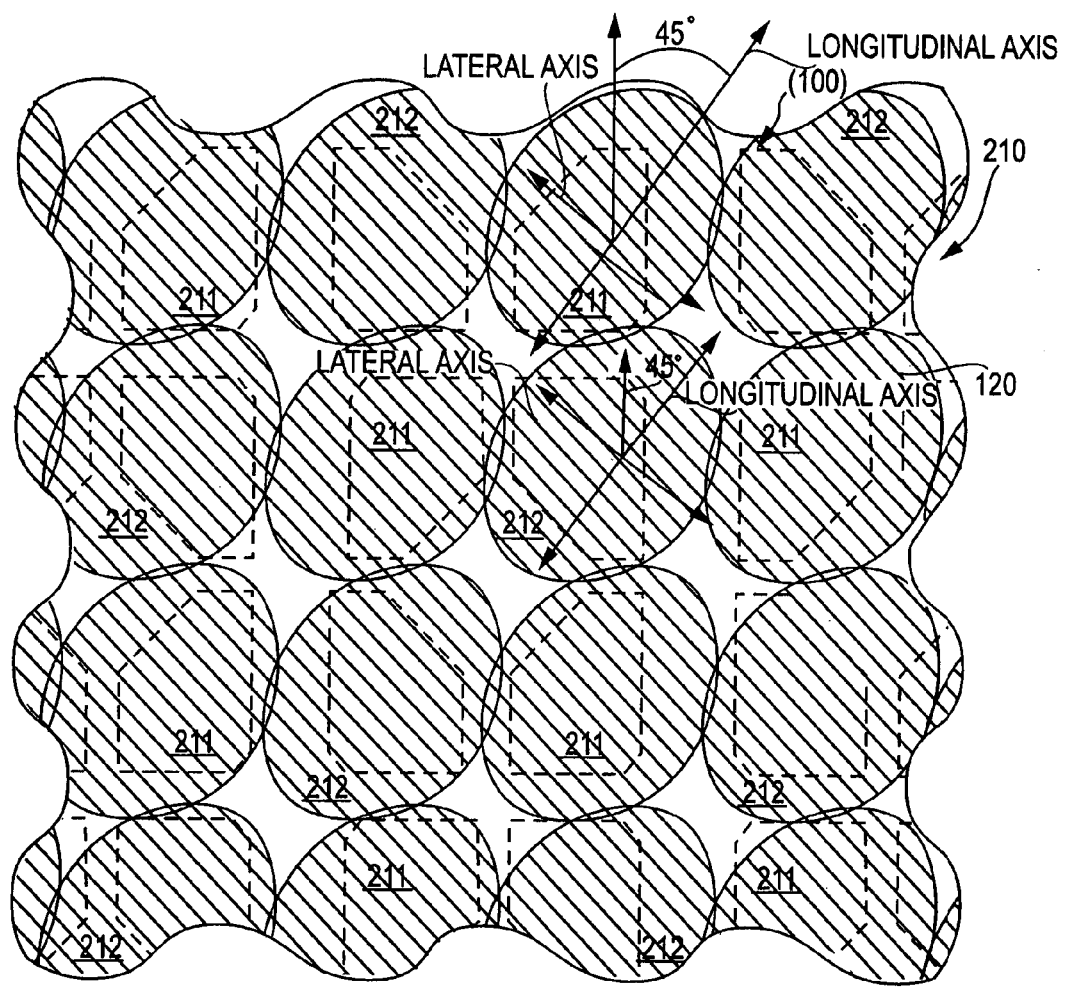
FIG. 6 is a top view of an array of microlenses constructed in accordance with another exemplary embodiment of the invention over the FIG. 1 array of pixels.

In another exemplary embodiment of the invention, the microlenses may all be elliptically-shaped and rotated about an axis of the array, maximizing the benefits of the elliptical shape. Referring to FIG. 6, an array of microlenses 210 formed over pixel array 100 is shown. The array 210 includes a plurality of first microlens 211 and a plurality of second microlenses 212, each being formed over the pixel array 100. The first microlenses 211 are formed for the first photosensitive areas 101 and the second microlenses 212 are formed for the second photosensitive areas 102. The first microlenses 211 are shown to have an elliptical shape, rotated about +45° from the vertical axis of the array 210. The second microlenses 212 are also shown to have an elliptical shape, rotated about +45° from the vertical axis of the array 210. The edges of second microlenses 212 slightly overlap the edges of first microlenses 211.

Each of the first microlenses 211 can be formed to have a first focal length in the longitudinal axis and a second focal length in the lateral axis, varied by adjusting the major and minor axes of the elliptical shape. Each of the second microlenses 212 can be formed to have a first focal length of similar length as the first focal length of the first microlenses 211 a second focal length of similar length as the second focal length of the first microlenses 211. Alternatively, the second microlenses 212 can be formed to have different focal lengths. In any case, the microlenses 211, 212 can be formed to have different focal lengths to cater to the shape and dimensions of the corresponding photosensitive areas 101, 102 in the substrate 120.

Figure 7:
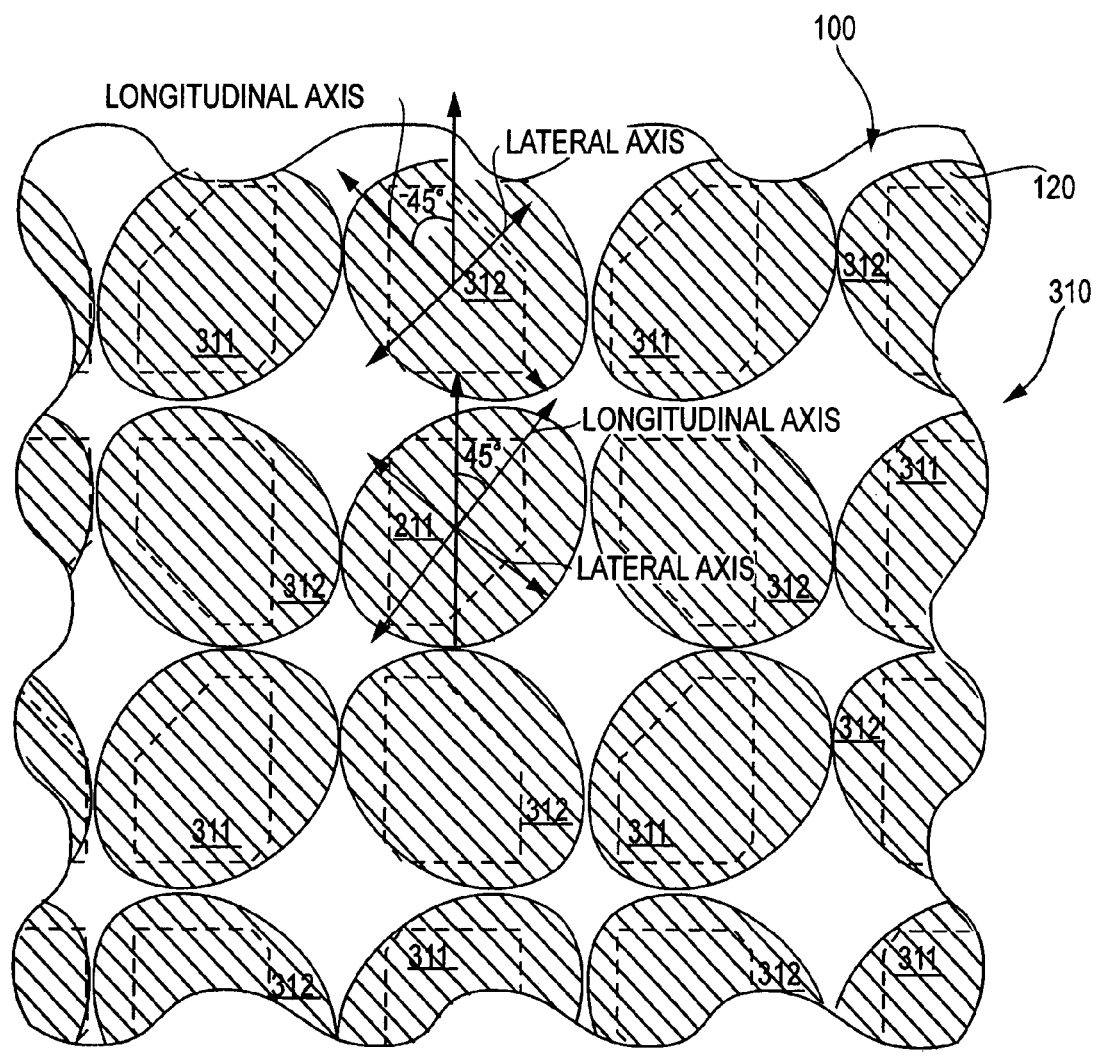
FIG. 7 is a top view of an array of microlenses constructed in accordance with another exemplary embodiment of the invention over the FIG. 1 array of pixels.

In another exemplary embodiment, the orientation of the elliptically-shaped microlenses may be different from one another. Referring to FIG. 7, an array of microlenses 310 formed over pixel array 100 is shown. The array 310 includes a plurality of first microlens 311 and a plurality of second microlens 312, each being formed over the pixel array 100. The first microlenses 311 are formed for the first photosensitive areas 101 and the second microlens 312 are formed for the second photosensitive areas 102. The first microlenses 311 are shown as having an elliptical shape, rotated about +45° from the vertical axis of the microlens array 310. The second microlenses 312 are also shown to have an elliptical shape, but rotated about −45° from the vertical axis of the array 310. The edges of second microlenses 312 slightly overlap the edges of first microlenses 311.

Each of the first microlenses 311 can be formed to have a first focal length in the longitudinal axis and a second focal length in the lateral axis, varied by adjusting the major and minor axes of the elliptical shape. Each of the second microlenses 312 can be formed to have a first focal length of similar length as the first focal length of the first microlenses 311 a second focal length of similar length as the second focal length of the first microlenses 311. Alternatively, the second microlenses 312 can be formed to have different focal lengths. In any case, the microlenses 311, 312 can be formed to have different focal lengths to cater to the shape and dimensions of the corresponding photosensitive areas 101, 102 in the substrate 120.

Figure 8:
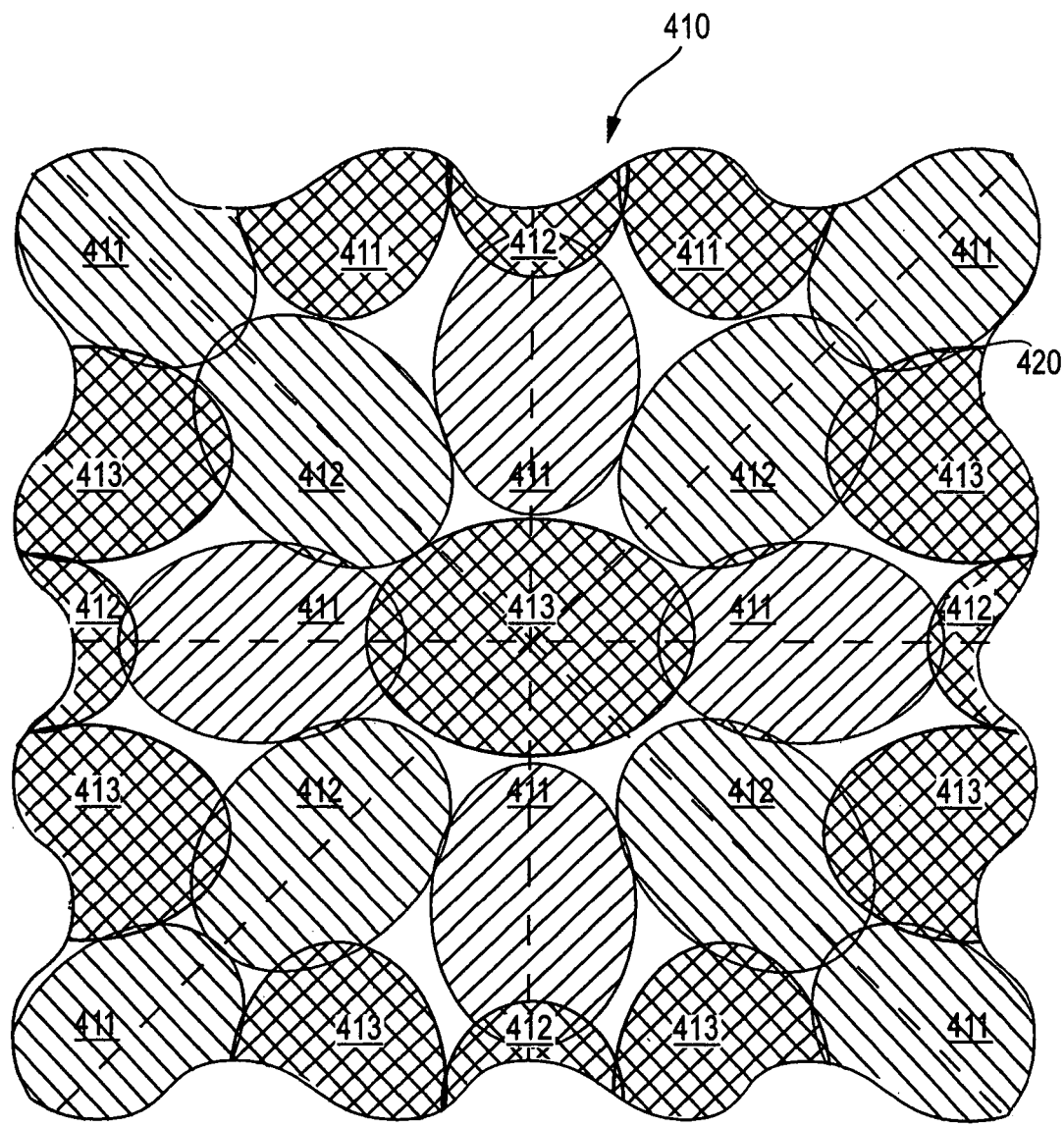
FIG. 8 is a top view of an array of microlenses constructed in accordance with another exemplary embodiment of the invention.

In another exemplary embodiment, the orientation of elliptically-shaped microlenses may be different from one another. For example, the microlens array may have a radial configuration around a center point C such that an extension of the longitudinal axes of all elliptically-shaped microlenses intersect at center point C. Referring to FIG. 8, an array of microlenses 410 is shown. The array 410 includes a plurality of first microlenses 411, a plurality of second microlenses 412, and a plurality of third microlenses 413, each being formed over a pixel array formed in substrate 420. The first microlenses 411 are shown to have an elliptical shape, rotated about 0°, +45°, −45°, or 90° from the vertical axis of the microlens array 410. The second microlenses 412 are also shown to have an elliptical shape, rotated about 0°, +45°, −45°, or 90° from the vertical axis of the array 410. The third microlenses 413 are shown to have a spherical shape or an elliptical shape, rotated +22.5°, −22.5°, +67.5°, or −67.5° from the vertical axis of the array 410. The edges of second microlenses 412 slightly overlap the edges of first microlenses 411, and the edges of third microlenses 413 slightly overlap the edges of first and second microlenses 411, 412.

Each of the first microlenses 411 can be formed to have a first focal length in the longitudinal axis and a second focal length in the lateral axis, varied by adjusting the major and minor axes of the elliptical shape. Each of the second microlenses 412 can be formed to have a first focal length of similar length as the first focal length of the first microlenses 411 a second focal length of similar length as the second focal length of the first microlenses 411. Likewise, the third microlenses 413 can be formed to have similar focal lengths as the first microlenses 411 or the second microlenses 412. Alternatively, the first, second and third microlenses 411, 412, 413 can be formed to have different focal lengths. In any case, the microlenses 311, 312 can be formed to have different focal lengths to cater to the shape and dimensions of the corresponding photosensitive areas in the substrate 420.

The formation of microlens array 410 is similar to the formation of microlens array 110. By depositing a microlens material, patterning, reflowing, and curing to create each plurality of microlenses 411, 412, 413, the first microlenses 411 are impervious to subsequent reflow during the formation of the second microlenses 412 and the second microlenses 412 are impervious to subsequent reflow during the formation of the third microlenses 413. Fabricating the microlens array 410 by forming the first microlenses 411 spaced apart, e.g., in a radial fashion, filling in the spaces with the second microlenses 412 formed in a separate process, and filling in the spaces with the third microlenses 413 formed in another separate process, bridging between first, second, and third microlenses 411, 412, 413 is diminished. This is because the first microlenses 411 have already gone through a reflow process that has rendered them impervious to any subsequent reflow process. Thus, the subsequent reflow of the second microlens material into the second microlenses 412 will not cause bridging between the first and second microlenses 111, 112. The microlens array 410 is approximately space-less since the formed microlenses abut one another.

An example of reflow conditions is described next. The shape of the microlenses after being subjected to reflow conditions is defined by several factors, including the thickness and type of material used to form the microlenses, the reflow temperature profile, and any pretreatment of the material that changes its glass transition temperature Tg. Examples of such pretreatments include ultraviolet light exposure or preheating the material to a temperature below the glass transition temperature Tg. An example of first reflow conditions may include providing first microlens material at a first thickness and from a first type of material, exposing the first microlens material with an ultraviolet light flood exposure of a specific dose, and reflowing at a first temperature ramp rate, followed by a cure. Second reflow conditions may include providing second microlens material of the first type of material at a second thickness and reflowing the second microlens material with the first temperature ramp rate, followed by a cure. Third reflow conditions may include providing a third microlens material of a second material type and of a third thickness, pre-heating the material to a temperature below the transition glass temperature Tg of the third microlens material for a set period of time, and then reflowing at a second temperature ramp rate, followed by a cure.

Figure 9:
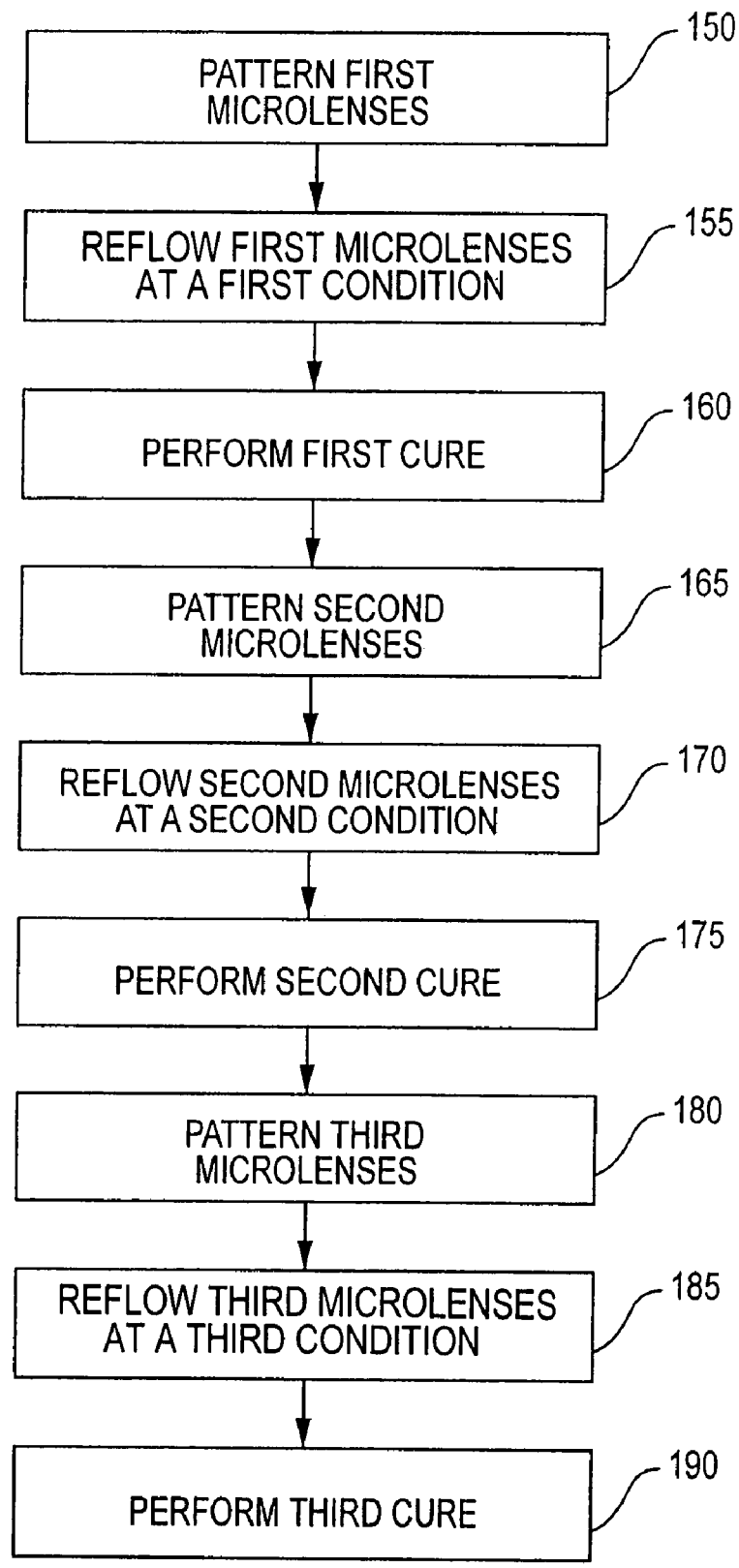
FIG. 9 illustrates a process for fabricating a microlens array of the present invention.

A process for forming a microlens array with reference to FIG. 9 is now described. At Step 150, a first microlens material is patterned on the substrate. The patterning, as described above, can be a checkerboard pattern or a radial pattern, which includes spaces between portions of the first microlens material. A single reticle may be used to prepare each of the first microlens material patterns. In the patterning step, a thin film of microlens material of a first thickness is coated on the substrate, the material is exposed using a suitable mask, and it is developed to either dissolve the exposed microlens material (positive resist) or dissolve the unexposed microlens material (negative resist). At Step 155, the first microlens material is reflowed at a first condition. Reflowing of the first microlens material turns the material into the first microlenses. At Step 160, the first microlenses are cured, thus forming a checkerboard pattern of solidly cross-linked first microlenses.

At Step 165, the second microlens material is patterned on the substrate in some of the spaces between the first microlenses. A single reticle may be used to prepare each of the second microlens material depositions. If the second microlens material patterns are of the same size and orientation as the first microlens material patterns (as described with reference to FIG. 6), the same reticle as was used for the pattern of the first microlens material patterns may be used for the pattern of the second microlens material patterns. For the pattern of the second microlens material, the reticle is shifted in the stepper job.

At Step 170, the second microlens material may be reflowed at a second condition to form the second microlenses. The second condition may differ from the first condition, for example, by varying the exposure and/or the dose of bleaching or the step baking temperature. By using different reflow conditions, the first microlenses and second microlenses can be formed having same or different focal lengths. At Step 175, a second cure is, performed.

In the formation of a microlens array having a third plurality of microlenses, Steps 180-190 are performed, otherwise the process is complete. At Step 180, wherein third microlens material is patterned in remaining open spaces between the first and second microlenses. At Step 185, the third microlens material may be reflowed at a third condition to form the third microlenses. The third condition may differ from the first and second conditions, for example, by varying the doses of exposing and/or bleaching or the step baking temperature. By using different reflow conditions, the third microlenses can be formed such that their focal lengths are the same or different than the focal lengths of the first and second microlenses. At Step. 190, a third cure is performed.

Figure 10:
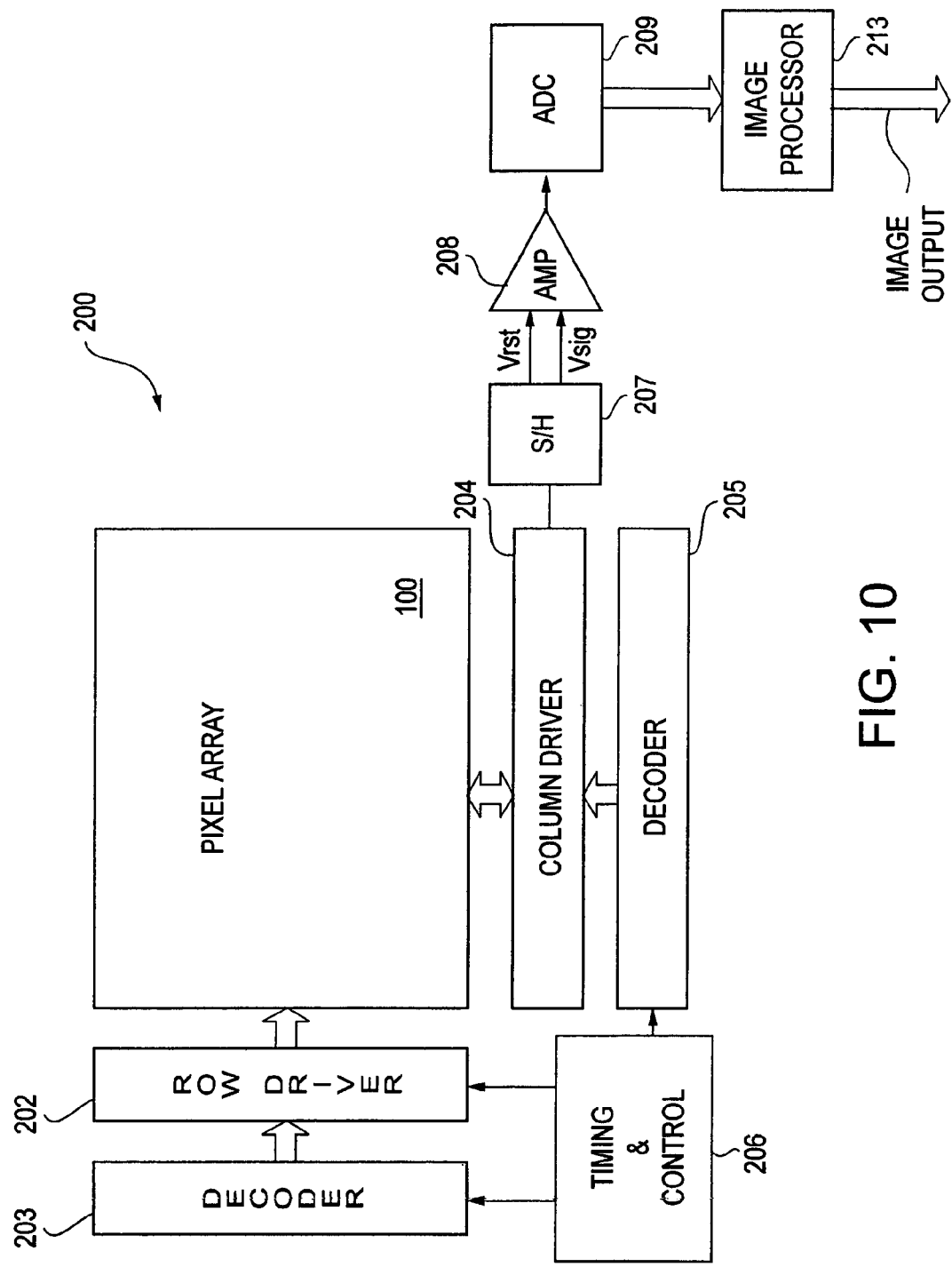
FIG. 10 is a schematic of an imaging device using a pixel having a microlens array constructed in accordance with an embodiment of the invention.

FIG. 10 illustrates an exemplary imaging device 200 that may utilize pixels having microlenses constructed in accordance with the invention. The imaging device 200 has an imager pixel array 100 comprising a plurality of pixels with microlenses constructed as described above. Row lines are selectively activated by a row driver 202 in response to row address decoder 203. A column driver 204 and column address decoder 205 are also included in the imaging device 200. The imaging device 200 is operated by the timing and control circuit 206, which controls the address decoders 203, 205. The control circuit 206 also controls the row and column driver circuitry 202, 204.

A sample and hold circuit 207 associated with the column driver 204 reads a pixel reset signal Vrst and a pixel image signal Vsig for selected pixels. A differential signal (Vrst-Vsig) is produced by differential amplifier 208 for each pixel and is digitized by analog-to-digital converter 209 (ADC). The analog-to-digital converter 209 supplies the digitized pixel signals to an image processor 213 which forms and outputs a digital image.

Figure 11:
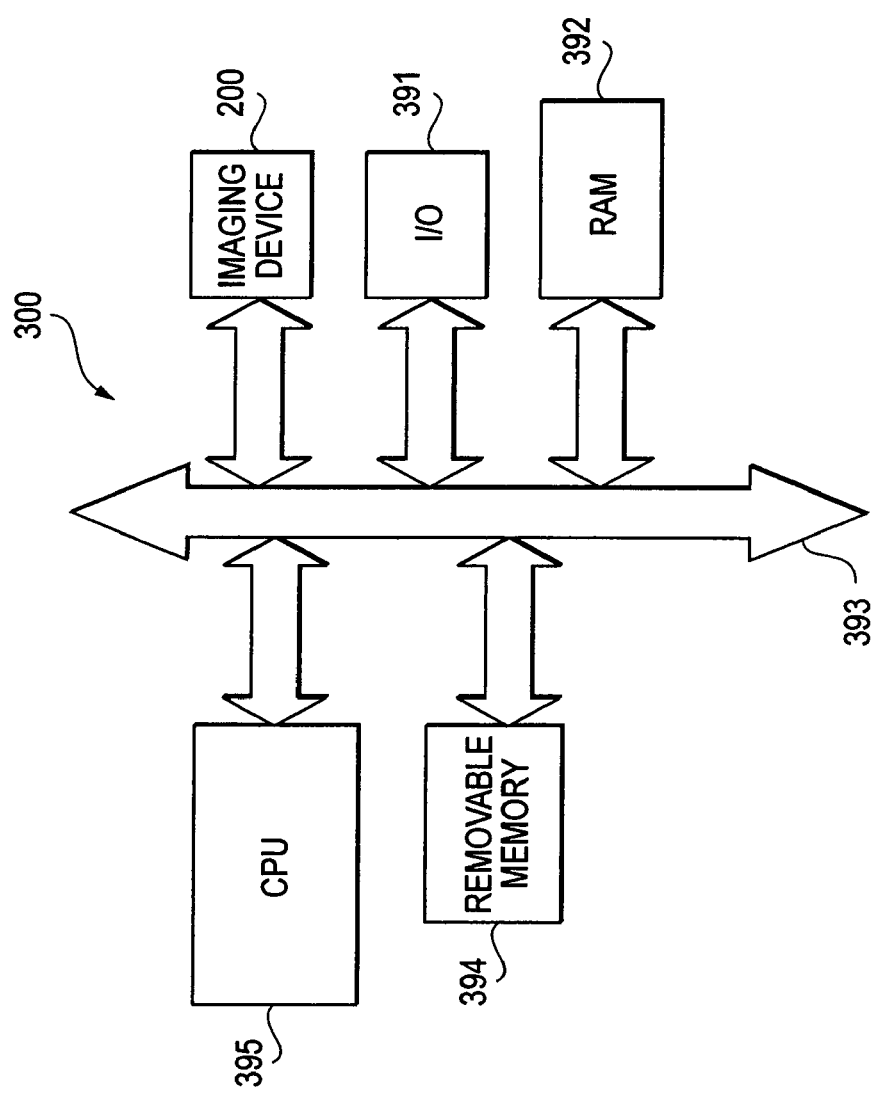
FIG. 11 illustrates a schematic of a processing system including the imaging device of FIG. 10.

FIG. 11 shows system 300, a typical processor system modified to include the imaging device 200 (FIG. 10) of the invention. The processor-based system 300 is exemplary of a system having digital circuits that could include image sensor devices. Without being limiting, such a system could include a computer system, still or video camera system, scanner, machine vision, vehicle navigation, video phone, surveillance system, auto focus system, star tracker system, motion detection system, image stabilization system, and data compression system.

The processor-based system 300, for example a camera system, generally comprises a central processing unit (CPU) 395, such as a microprocessor, that communicates with an input/output (I/O) device 391 over a bus 393. Imaging device 200 also communicates with the CPU 395 over bus 393. The processor-based system 300 also includes random access memory (RAM) 392, and can include removable memory 394, such as flash memory, which also communicate with CPU 395 over the bus 393. Imaging device 200 may be combined with a processor, such as a CPU, digital signal processor, or microprocessor, with or without memory storage on a single integrated circuit or on a different chip than the processor.

While the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, while the microlens arrays are shown with microlenses abutting one another, since multiple reflow processes are performed, subsequently formed microlenses can overlap previously formed microlenses. Furthermore, while some microlenses are shown rotated at specific degrees of rotation (e.g., 0°, +45°, −45°, 90°, +22.5°, −22.5°, +67.5°, or −67.5°) from the vertical axis of the microlens arrays, the major axes of the elliptical microlenses may be turned in any suitable direction. Furthermore, instead of three reflow processes, only two reflow processes may be performed, or more than three reflow processes may be performed. Accordingly, the invention is not to be seen as limited by the foregoing description, but is only limited by the scope of the appended claims.

What is claimed as new and desired to be protected by Letters Patent of the United States is:

1. An imager comprising:
   a pixel array formed in a substrate, said pixel array having an array of at least first and second photosensitive areas, each pixel in said pixel array including at least one of the first and second photosensitive areas, at least the first photosensitive areas being asymmetrical; and
   a first set of microlenses over said pixel array, said first set of microlenses having first and second focal lengths.

2. The imager of claim 1, wherein said first set of microlenses is elliptically-shaped.

3. The imager of claim 2, wherein said elliptically-shaped microlenses have longitudinal axes which are offset from a vertical axis of said first microlens array by an angle.

4. The imager of claim 1, further comprising a second set of microlenses.

5. The imager of claim 4, wherein said second set of microlenses is substantially square-shaped.

6. The imager of claim 4, wherein each microlens of said second set of microlenses is located between two microlenses of said first set of microlenses.

7. The imager of claim 4, wherein said microlens array is arranged in a checkerboard pattern.

8. The imager of claim 4, wherein said microlens array is arranged in a radial pattern.

9. The imager of claim 4, further comprising a third set of microlenses, wherein each microlens of said third set of microlenses is located between two microlenses of said first and second set of micro lenses.

10. A method of forming an imaging device comprising:
    providing a pixel array with each pixel having at least one asymmetrical photosensitive area;
    patterning a first set of microlens material over said pixel array;
    reflowing the first set of microlens material under first reflow conditions;
    curing the first set of microlens material to form a first set of microlenses;
    patterning a second set of microlens material over said pixel array;
    reflowing the second set of microlens material under second reflow conditions; and
    curing the second set of microlens material to form a second set of microlenses, wherein the first set of microlens material is patterned such that said first set of microlens material forms an elliptical shape under said first reflow conditions.

11. The method of claim 10, wherein said first reflow conditions are different from said second reflow conditions.

12. The method of claim 10, wherein said step of patterning the first set of microlens material comprises patterning the first set of microlens material into a first plurality of portions arranged in a checkerboard pattern, the checkerboard pattern including spaces between said portions.

13. The method of claim 12, wherein said step of patterning the second set of microlens material comprises patterning the second set of microlens material into second plurality of portions arranged in a complimentary checkerboard pattern filling in at least some of said spaces between the first plurality of portions.

14. The method of claim 10, wherein said step of patterning the first set of microlens material comprises patterning the first set of microlens material into a first plurality of portions arranged in a radial pattern having spaces between said first plurality of portions.

15. The method of claim 14, wherein said step of patterning the second set of microlens material comprises patterning the second set of microlens material into a second plurality of portions filling at least some of said spaces between said first plurality of portions.

16. The method of claim 10, further comprising the steps of:
- patterning a third set of microlens material over said pixel array;
- reflowing the third set of microlens material under third reflow conditions; and
- curing the third set of microlens material to form a third set of microlenses.

17. The method of claim 16, wherein said third reflow conditions are different from said first and second reflow conditions.

18. The method of claim 17, wherein the third set of microlens material is patterned such that said third set of microlens material forms an elliptical shape under said third reflow conditions.

* * * * *